United States Patent [19]

Tai et al.

[11] Patent Number: 4,496,448
[45] Date of Patent: Jan. 29, 1985

[54] METHOD FOR FABRICATING DEVICES WITH DC BIAS-CONTROLLED REACTIVE ION ETCHING

[75] Inventors: King L. Tai; Frederick Vratny, both of Berkeley Heights, N.J.

[73] Assignee: AT&T Bell Laboratories, Murray Hill, N.J.

[21] Appl. No.: 541,459

[22] Filed: Oct. 13, 1983

[51] Int. Cl.³ ............................................. C23C 15/00
[52] U.S. Cl. ............................. 204/192 E; 204/192 R; 204/192 EC; 204/298; 156/345; 156/643
[58] Field of Search ............... 204/192 E, 192 R, 298, 204/192 EC; 156/345, 643

[56] References Cited

U.S. PATENT DOCUMENTS

| | | | |
|---|---|---|---|
| 3,664,942 | 5/1972 | Havas et al. | 204/192 E |
| 3,708,418 | 1/1973 | Quinn | 204/192 E |
| 3,730,873 | 5/1973 | Pompei et al. | 204/192 E |
| 3,816,198 | 6/1974 | La Combe et al. | 204/192 E |
| 4,233,515 | 11/1980 | Dietrich et al. | 250/492.3 |
| 4,283,260 | 8/1981 | Thomas et al. | 204/298 |
| 4,312,732 | 1/1982 | Degenkolb et al. | 204/192 E |
| 4,333,814 | 6/1982 | Küyel | 204/298 |
| 4,340,456 | 7/1982 | Robinson et al. | 204/192 E |
| 4,357,195 | 11/1982 | Gorin | 204/298 |
| 4,362,611 | 12/1982 | Logan et al. | 204/298 |
| 4,422,897 | 12/1983 | Horwitz | 204/192 EC |

OTHER PUBLICATIONS

Geipel IBM Technical Disclosure Bulletin 20 (1977), pp. 541-542.

Primary Examiner—Arthur P. Demers
Attorney, Agent, or Firm—Bernard Tiegerman; Bruce S. Schneider

[57] ABSTRACT

A method and apparatus for fabricating a device is disclosed, which method involves a new reactive ion etching technique. Both a high etch rate and, for example, a high etch selectivity are simultaneously achieved with the inventive reactive ion etching technique by discharging an electrode of the reactive ion etching apparatus in response to a preselected criterion, e.g., a magnitude of a DC bias at said electrode which equals, or exceeds, a preselected value.

13 Claims, 5 Drawing Figures

METHOD FOR FABRICATING DEVICES WITH DC BIAS-CONTROLLED REACTIVE ION ETCHING

BACKGROUND OF THE INVENTION

1. Field of the Invention

The invention pertains generally to the fabrication of devices and, more particularly, to the fabrication of semiconductor devices.

2. Art Background

The fabrication of devices, e.g., semiconductor devices, typically involves the etching of patterns into substrates, e.g., (1) silicon wafers or (2) silicon wafers which are being processed and are thus wholly or partially covered by regions of materials such as metal, polysilicon, or silicon dioxide. Generally, a pattern is etched into a substrate by initially forming a masking layer, e.g., a resist, on the substrate, removing selected portions of the masking layer, and then etching the exposed portions of the substrate.

It is possible to produce either isotropic etching or anisotropic etching in the exposed substrate portions. (In isotropic etching, a layer of material is etched in both a first direction, perpendicular to the major surface of the layer, and a second direction, transverse to the first direction, the etch rates in the two directions being approximately equal. In anisotropic etching, the etch rate in the second direction is less than that in the first direction.) If very fine line features are to be etched into the exposed portions of a layer of substrate material, then anisotropic etching is generally preferred over isotropic etching to avoid obliterating the features (through transverse etching) during the time required to etch the layer through its thickness. Thus, anisotropic etching is useful, among other things, for producing the very fine line etching required in the fabrication of a variety of devices including, for example, very large scale integrated (VLSI) semiconductor devices.

One method for producing anisotropic etching is reactive ion etching (RIE). In RIE, a substrate to be etched is mounted on an electrode arranged within a vacuum chamber, an etchant gas is introduced into the chamber, and a plasma (which includes electrons and positive and negative ions) is established within the gas. Typically, the substrate includes several different layers of material, only one of which is to be etched. Thus, the etchant gas is chosen so that the plasma produced in the gas includes chemically reactive positive or negative ions which selectively etch the substrate, i.e., selectively chemically etch the one layer of the substrate to be eched. The chemical etching results in the formation of a volatile reaction product which is pumped out of the chamber.

If the electrode on which the substrate is mounted is, for example, a free-floating electrode (an electrode whose electrical potential is allowed to float), then the electrode (by virtue of its partial or total immersion in the plasma) will develop a negative or positive DC bias relative to a point of reference potential, such as ground. (The DC bias is negative or positive depending on the nature of the plasma, the position of the electrode within the plasma, and the material properties of the electrode.) Under the influence of the DC bias, either positive or negative ions (depending on whether the DC bias is negative or positive) are accelerated toward the electrode. The directed motion imparted to the ions by the DC bias, as well as the chemical reactivity of the ions, results in the selective, anisotropic chemical etching of the substrate.

The magnitude of the DC bias at the electrode significantly affects, for example, the degree of the anisotropic etching (the smaller the magnitude of the DC bias, the lower the degree of anisotropic etching) and thus the shape of the etch profile. In addition, the magnitude of the DC bias significantly affects the etch selectivity between a substrate layer to be etched and material layers not to be etched, e.g., the masking material or other layers of substrate material. For example, a DC bias just sufficient to impose directionality on the reactive species will draw the reactive species to the electrode at a speed sufficient to cause sputter removal of a relatively small amount of masking material or substrate material which is not to be removed. However, an increase in the magnitude of the DC bias significantly above that required to impose directionality will result in the sputter removal of an undesirably large amount of material which is not to be removed. Consequently, control of DC bias is highly desirable, among other things, to achieve a desired etch profile, e.g., an essentially vertical, inclined, or curved etch profile, and to avoid undesirably large reductions in etch selectivity.

There is a variety of techniques for producing RIE. The differences between these techniques lie, in part, in the methods employed to produce the plasma. For example, in one technique the plasma is produced by a DC discharge, i.e., by imposing a sufficiently high DC voltage between two electrodes placed across (but not necessarily immersed within) a gas. (Regarding plasmas formed by DC discharges see, e.g., B. Chapman, *Glow Discharge Processes* (John Wiley & Son, 1980), p. 77.) Such a technique is adequate in many situations. However if either the substrate being etched, or the electrode supporting the substrate, includes dielectric material, then etching is difficult to maintain.

In another technique for producing RIE the plasma is formed by inductively coupling AC power into the gas. Such inductive coupling is achieved, for example, by applying an AC voltage across the primary winding of a transformer whose secondary winding encircles a chamber containing the gas. Alternatively, an AC voltage is directly applied to an induction coil which either encircles the chamber or is arranged within the chamber. (In regard to inductive coupling see, e.g., J. Vossen and W. Kern, eds., *Thin Film Processes* (Academic Press, 1978), Ch. 4, pp. 338–341.) Again, this technique is employed to advantage in many situations. However, in this technique the ions acquire a helical-type motion (in addition to the directed motion imparted by the DC bias on the substrate-supporting electrode) that reduces somewhat the degree of anisotropic etching.

The most widely used commercial technique for producing RIE, which employs radio frequency (rf) power for plasma production, does not have the limitations present in the other methods. An RIE machine which employs such rf power is the conventional, parallel plate RIE machine 10, depicted in FIG. 1, which includes two electrodes 18 and 20 arranged within a vacuum chamber 12. The RIE machine 10 also includes an inlet 16 through which an etchant gas (or gases) is introduced into the chamber 12, as well as an outlet 14 through which volatile reaction products are pumped out of the chamber 12.

RF power is capacitively coupled into an etchant gas introduced into the chamber 12 by connecting one of the electrodes, e.g., the electrode 18, to a point of reference potential, such as ground. In addition, an rf voltage is applied to the other electrode, e.g., the electrode 20, by an rf voltage generator 24, through an impedance matching network 26 and capacitor 28 (hence, capacitive coupling), as shown in FIG. 1. The electrode 18 in this particular configuration thus constitutes the anode while the electrode 20 constitutes the cathode of the RIE machine 10.

The application of the rf voltage signal, or any other form of power, not only produces a plasma in the gas, but also results in the cathode 20 acquiring a negative (relative to the grounded anode 18) DC bias. In operation, a substrate 22 to be etched is mounted on the cathode 20 (see FIG. 1) and undergoes anisotropic chemical etching by positive ions accelerated toward the cathode by its negative DC bias. (Mounting the substrate on the anode 18 generally leads to isotropic, rather than anisotropic, etching.)

It is generally believed that the DC bias at the cathode 20 is due to the formation of a sheath of electrons at the surface of the cathode 20. The capacitor 28, which presents a high impedance to low-frequency and DC signals (while presenting a low impedance to the high-frequency signal produced by the rf generator 24), blocks the electron sheath (a DC signal) from being discharged through the rf generator to ground.

The magnitude of the DC bias at the cathode 20 is largely determined by the amount of rf power delivered to the cathode 20, as well as the pressure and composition of the gaseous atmosphere within the chamber 12. (Power, pressure, and gas composition are also largely determinative of the DC bias in RIE systems which employ different power producing means, e.g., DC discharges or inductive coupling.) Because these factors are readily controlled, DC bias is readily controlled, thus permitting enhanced control of, for example, etch profile and etch selectivey. For example, an increase in rf power (achieved by increasing the amplitude and/or frequency of the rf voltage signal) and/or a decrease in pressure results in a higher, i.e., a more negative, cathode DC bias.

The factors determining the magnitude of the DC bias, also determine the etch rate (irrespective of the nature of the power producing means). For example, an increase in rf power results in an increase in etch rate, as well as an increase in the magnitude of the DC bias. In fact, the magnitude of the DC bias is a reliable measure of rf power flow and etch rate. Indeed, it has long been believed that the DC bias is so intimately intertwined with the rf power flowing into the plasma that any attempt to decrease DC bias (independently of rf power and pressure) by, for example, withdrawing current from the cathode, will necessarily result in a significant decrease in rf power flowing to the plasma, and thus a significant decrease in etch rate.

A high etch rate is generally desirable for purposes of economy. But a high etch rate is often accompanied by an undesirably high DC bias, which results, for example, in undesirably low-etch selectivity. Moreover, if the substrate being etched includes one or more layers of dielectric material, then these layers often suffer undesirable electrical breakdown when exposed to a high DC bias.

The constraints imposed on the factors which determine etch rate and DC bias, e.g., rf power and pressure, conflict when both a high etch rate and, for example, a high etch selectivity are desired. Consequently, etch rates are generally maintained at a relatively low level to achieve high etch selectivities. Although a technique for controlling the DC bias, independently of rf power and pressure, to achieve both high etch rates and high etch selectivities has been sought, a solution has not be found.

SUMMARY OF THE INVENTION

The invention involves the achievement of both a high etch rate and, for example, a high etch selectivity or a desired etch profile exhibiting a relatively large degree of undercutting in a reactive ion etching process. This achievement derives from the finding that the magnitude of the DC bias which develops on an electrode, e.g., a free-floating electrode or the cathode electrode of a conventional RIE machine (the electrode through which rf power is capacitively coupled into the machine), is readily reduced by conducting current from the electrode to a point of reference potential. Moreover, and contrary to the accepted wisdom, the magnitude of the DC bias is reduced without significantly affecting power flow to the plasma. Thus, for example, a high etch selectivity or a desired etch profile is achieved (while maintaining a relatively high etch rate), according to the invention, by conducting current from an electrode that has developed a DC bias whose magnitude is unacceptably large to a point of reference potential.

DETAILED DESCRIPTION

Figure 1:
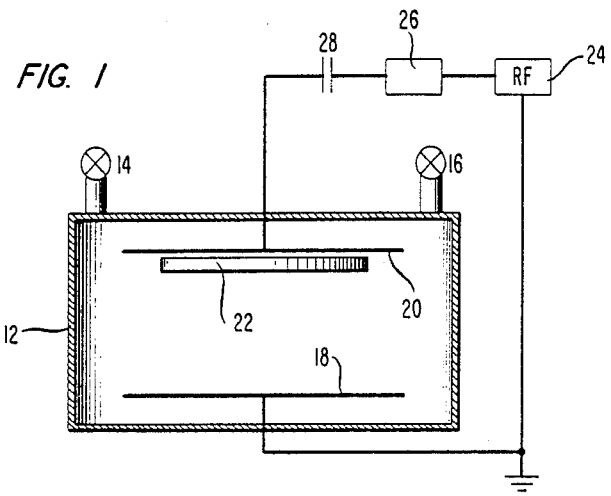
FIG. 1 is a cross-sectional view of a conventional, parallel-plate reactive ion etching machine.

The invention involves a new method and apparatus for fabricating a device, e.g., a semiconductor device, through the reactive ion etching (RIE) of a substrate. In previous RIE techniques power flow, and thus etch rate, was maintained at a relatively low level, e.g., etch rates were typically 100 Angstroms per minute or less, to achieve a desired goal, such as a desired etch selectivity between a substrate layer to be etched and other material layers or a desired etch profile exhibiting a relatively large or varying amount of undercutting. But with the inventive technique, both the desired goal and a relatively high etch rate, typically 200 Angstroms per minute or more, are simultaneously achieved. This result is attained by supplying more power than previously used to achieve the desired goal, e.g., the desired etch selectivity or the desired etch profile, while also conducting current from the DC-biased electrode to a point of reference potential, such as ground, in response to a preselected criterion. For example, if the goal to be achieved is a desired etch profile exhibiting a relatively large degree of undercutting (which is either constant or which varies in a desired manner) then current is conducted from the DC-biased electrode in response to a deviation from this profile. (For purposes of the invention, an electrode is a structure which permits charge transfer between itself and its surroundings, e.g., a plasma or a point of reference potential, and includes, for example, part or all of the substrate.) Alternatively, if the goal to be achieved is a desired etch selectivity, then current is conducted from the DC-biased electrode in response to a DC bias on the electrode whose magnitude (absolute value) equals, or exceeds, a preselected value. The preselected value is the DC bias (generally determined empirically) needed to achieve the desired etch selectivity. Here, the process of conducting current from an electrode to a point of reference potential will be referred to as discharging, it being understood that as a result of this process the electrode is not necessarily depleted of charge.

The inventive technique of discharging an electrode to achieve a desired goal (while etch rate is maintained relatively high), e.g., a desired etch selectivity, is applicable to a wide variety of RIE techniques. For example, both a relatively high etch rate and an enhanced etch selectivity are readily achieved by discharging a substrate-supporting floating electrode (partially or totally) immersed in a plasma, in response to a DC bias whose magnitude equals, or exceeds, a preselected value, regardless of how the plasma is formed, e.g., by a DC discharge or by capacitive or inductive coupling of AC power. (Etch selectivities are enhanced in RIE systems which employ DC discharges or inductive coupling although the limitations presently associated with these systems have not been eliminated.) In the particular use of rf power for RIE, the same desirable results are achieved by discharging the substrate-supporting supporting cathode electrode (the electrode through which rf power is capacitively coupled into a gas) of a conventional RIE machine, in response to a DC bias whose magnitude equals, or exceeds, a preselected value. Contrary to the accepted wisdom, such discharging does not significantly affect rf power flow to the plasma, and thus does not significantly affect etch rate.

The inventive discharging technique is also not limited to any particular RIE machine. Rather, the inventive technique is applicable to a wide variety of RIE machines including, for example, the RIE machine disclosed in U.S. Pat. No. 4,298,443 issued to D. Maydan on Nov. 3, 1981.

Preferably, in accordance with the inventive reactive ion etching technique, the discharging of an electrode, e.g., a cathode or free-floating electrode, is done automatically, i.e., without human intervention. If, for example, a desired etch selectivity is to be achieved, then the discharge rate is preferably high enough to reduce the magnitude of the DC bias at the electrode to the preselected value within a time period less than about one-tenth, and more preferably less than about one-hundredth, the total etch time. A time period larger than about one-tenth the total etch time is undesirable because this results in undesirably low etch selectivity and, if the substrate being etched includes one or more layers of dielectric material, then these layers often suffer undesirable electrical breakdown.

It is particularly significant that reducing the magnitude of the DC bias at the cathode electrode of a conventional RIE machine unexpectedly enhances the directionality of the etching suffered by a substrate mounted on the anode electrode, i.e., the etching at the anode becomes more anisotropic (provided rf power, pressure, and electrode spacing are unchanged). It has been found that this effect becomes more pronounced as the magnitude of the DC bias at the cathode is reduced. In general, the degree to which anisotropic etching at the anode is enhanced as the magnitude of the DC bias at the cathode is reduced is determined empirically. Thus, a substrate mounted on the anode is readily anisotropically etched, even at a relatively high etch rate (the anisotropy being achieved and maintained by means of the inventive discharging technique).

Figure 2:
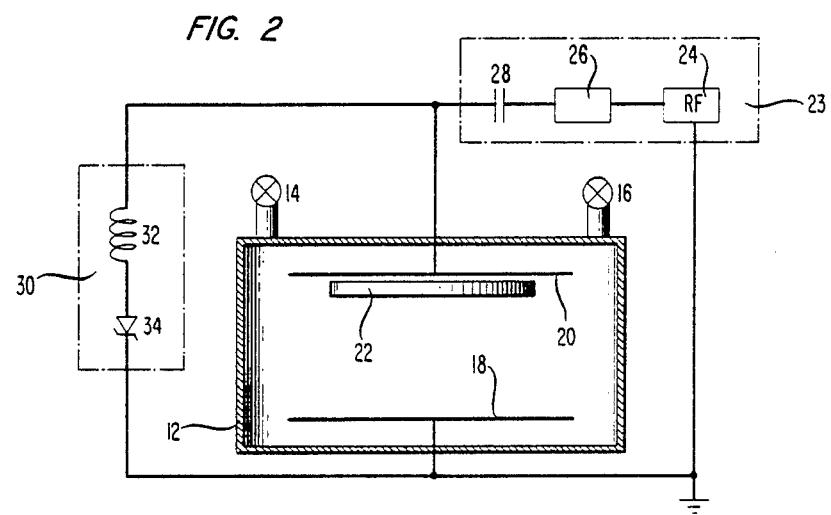
FIGS. 2-5 depict embodiments of an inventive apparatus for producing both a high etch rate and a high etch selectivity during the reactive ion etching of a substrate.

An apparatus for effecting the inventive reactive ion etching technique is depicted in FIG. 2 and includes a substrate-supporting electrode 20 housed within a vacuum chamber 12, and a power source 23 for forming a plasma within an etchant gas introduced into the chamber 12. If power is, for example, capacitively coupled into the gas, then the power source 23 includes the rf generator 24, the impedance matching network 26, and capacitor 28, depicted in FIG. 2. In addition, the apparatus includes a circuit 30, extending between the electrode 20 and a point of reference potential, e.g., ground, which automatically conducts current from the electrode 20 to ground in response to a DC bias on the electrode having a magnitude which equals, or exceeds, a preselected value. (If the bias on a free-floating electrode is to be controlled, then the circuit 30 extends from the free-floating electrode to the point of reference potential). Preferably (as shown in FIG. 2), the circuit 30 includes a Zener diode 34 (or two or more series-connected Zener diodes) whose breakdown voltage is equal to the preselected value. In operation, if the magnitude of the DC bias equals or exceeds the preselected value, i.e., the Zener diode's breakdown voltage, then the Zener diode 34 will automatically conduct current from the electrode 20 to the point of reference potential. Moreover, the quantity of current conducted by the Zener diode will increase as the magnitude of the DC bias increases above the Zener diode's breakdown voltage.

Figure 3:
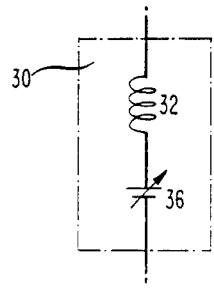
Figure 4:
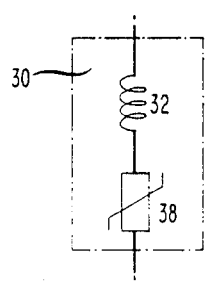
Figure 5:
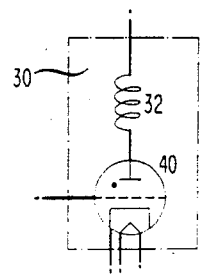

Other embodiments of the inventive apparatus include functional equivalents of the Zener diode 34, i.e., devices which will conduct current at a preselected voltage. For example, in the second embodiment of the apparatus, depicted in FIG. 3, the Zener diode in the circuit 30 is replaced by a voltage-controlled DC power supply 36, while in the third embodiment, depicted in FIG. 4, the Zener diode is replaced by a metal oxide varistor 38 (or two or more series-connected varistors). (Regarding metal oxide varistors see, e.g., *Transient Voltage Suppression Manual* (2d ed.), John C. Hey and William P. Kram, eds. (General Electric Company, Auburn, N.Y., 1978), pp. 87 and 115.). In a fourth embodiment, depicted in FIG. 5, the Zener diode is replaced by a thyratron 40 (or two or more series-connected thyratrons). (Regarding thyratrons, see, e.g., *Standard Handbook for Electrical Engineers* (10th ed.), Donald G. Fink and John M. Carroll, eds. (McGraw Hill, 1968), pp. 28-14 through 28-15).

In embodiments of the inventive apparatus where the Zener diode 34 (or its functional equivalents) is exposed to a high frequency voltage signal, e.g., the high frequency signal produced by the rf generator 24, then the circuit 30 preferably includes a component which shields the Zener diode (or its functional equivalents) from the high frequency signal. Such a component is, for example, the induction coil 32 shown in FIGS. 2-5. The induction coil 32, which is placed in series with the Zener diode 34 (or its functional equivalents), performs the desired shielding function because the coil presents a low impedance to the DC current drawn from the electrode, while presenting a high impedance to the high frequency voltage signal produced by, for example, the rf generator 24.

Yet another apparatus for effecting the inventive reactive ion etching technique, which permits a DC biased electrode to be discharged in response to a wide variety of preselected criteria, includes a computer-controlled DC power supply in place of the Zener diode 34. A useful computer is, for example, the commercially available Model HP 9845B computer sold by the Hewlett-Packard Company of Culverton, Calif., while a useful DC power supply is the commercially available Model HP 4140B power supply also sold by Hewlett-Packard. In one mode of operation, the magnitude of the DC bias on an electrode is sensed and communicated to the computer (by conventional means), and this magnitude is compared by the computer with a preselected value stored in the computer. The computer is programmed so that if the former exceeds the latter, the power supply discharges the electrode.

If the DC bias is to vary as a function of etch depth, in order to produce a varying degree of undercutting during etching, then the above apparatus also includes, for example, means for monitoring etching, e.g., a conventional, optical interferometric device for monitoring etch depth. In operation, both the measured etch depth and the measured DC bias are communicated to the computer (by conventional means). The measured DC bias at a particular etch depth is then compared by the computer with the corresponding DC bias for that each depth stored in the computer. (The computer, in essence, compares a detected etch profile against a desired etch profile. The stored DC biases which yield the desired etch profile are generally determined empirically.) Again, the computer is programmed so that, for example, if the magnitude of the former exceeds the magnitude of the latter, the power supply discharges the electrode.

In accordance with the inventive fabrication method a device, e.g., a semiconductor device, is fabricated by mounting a substrate on an electrode of a reactive ion etching machine. The electrode is, for example, a free-floating electrode or the electrode 20 of the RIE machine 10 shown in FIG. 2.

An etchant gas (or gases) is introduced into the chamber housing the electrode, e.g., the chamber 12 of FIG. 2, and a plasma is produced in the gas by coupling either AC or DC power into the gas (the AC power is either capacitively or inductively coupled into the gas). The gas is chosen so that the plasma contains either positive or negative ions which selectively chemically etch the substrate.

A variety of gases are useful in the practice of the invention including $CCl_4$, $CCl_3H$, $CCl_3F$, $CCl_2F_2$, $CCl_2H_2$, $CF_4$, $CHF_3$, $CClF_3$, $Cl_2$, $F_2$, and $BCl_3$. For example, an etchant gas which shows relatively high etch selectivity for silicon relative to silicon dioxide is $Cl_2$ (when $Cl_2$ is ionized, $Cl^{2+}$ and $Cl^+$ ions are formed which chemically react with silicon). On the other hand, an etchant gas which shows relatively high etch selectivity for silicon dioxide relative to an organic polymer such as HPR-206 photoresist sold by the Philip A. Hunt Chemical Corporation of Palisades Park, N.J., is $CHF_3$ (when $CHF_3$ is ionized, $CF_3^+$ is formed which chemically reacts with silicon dioxide).

Typically, $Cl_2$ is introduced into an etching chamber at a pressure ranging from about 4 millitorr to about 80 millitorr. On the other hand, $CHF_3$ is typically introduced at a pressure ranging from about 2 millitorr to about 65 millitorr. In both cases, the flow rates range from about 0.1 ft$^3$/min to about 10 ft$^3$/min, while power densities range from about 0.1 watts/cm$^2$ to about 1 watt/cm$^2$. A pressure less than about 4 millitorr (in the case of $Cl_2$) or 2 millitorr (in the case of $CHF_3$) is undesirable because the plasma is likely to be extinguished. Moreover, a pressure greater than about 80 millitorr (in the case of $Cl_2$) or 65 millitorr (in the case of $CHF_3$) is undesirable because etch rates become undesirably low. A flow rate less than about 0.1 ft$^3$/min is undesirable because this results in undesirably little refreshing (the formation of new ions), of the plasma, while a flow rate greater than about 10 ft$^3$/min is likely to result in the flow partially, or totally, sweeping the plasma out of the etching chamber. In addition, a power density less than about 0.1 watts/cm$^2$ is undesirable because the plasma is likely to be unstable, while a power density greater than about 1 watt/cm$^2$ is undesirable because the plasma gives off an undesirably large amount of heat (difficult to dissipate) and etching becomes nonuniform.

A distinction exists between substrates which include both insulating and noninsulating materials, and substrates which only include noninsulating materials. (An insulating material is one whose resistivity is greater than about $10^4$ ohm-cm, while a noninsulating material is one whose resistivity is less than about $10^4$ ohm-cm). In the former case, the substrate is preferably reactive ion etched in a plasma formed by coupling AC power into a gas. Moreover, the frequency of the AC power ranges from about 0.01 MHz to about 500 MHz. Both DC power and AC power of frequencies less than about 0.01 MHz are undesirable because little or no etch selectivity is achieved between the insulating and noninsulating materials. In addition, such frequencies produce either no DC bias, or so small a DC bias, on the electrode that little or no anisotropic etching occurs. Frequencies greater than about 500 MHz are undesirable because they lead to DC biases which are of such short duration that little or no anisotropic etching occurs.

In the case of substrates which only include noninsulating materials, both DC and AC power is useful. The frequency of the AC power is preferably less than about 500 MHz for the reason given above.

During the reactive ion etching of the substrate, a desired goal is achieved (while etch rate is largely unaffected) by discharging the substrate-supporting electrode, e.g., a free-floating electrode or the electrode 20 of the RIE machine 10, in response to a preselected criterion. If the desired goal is a high etch selectivity, then this goal is achieved by discharging the electrode in response to a DC bias having a magnitude which equals, or exceeds, a preselected value. For example, a 50-to-1 etch selectivity for silicon relative to silicon dioxide is achieved during reactive ion etching in a $Cl_2$ atmosphere by discharging the electrode in response to a DC bias whose magnitude is equal to, or greater than, about 35 volts. On the other hand, a 50-to-1 etch selectivity for silicon dioxide relative to HPR-206 is achieved during reactive ion etching in a $CHF_3$ atmosphere by discharging the electrode in response to a DC bias whose magnitude is equal to, or greater than, about 25 volts.

If the desired goal is an etch profile exhibiting a relatively large or varying amount of undercutting, then this goal is achieved by, for example, discharging the substrate-supporting electrode (thus reducing the degree of anisotropic etching) in response to an etch profile (or any portion of the profile) whose degree of undercutting is less than desired. A similar goal is achieved by mounting the substrate on the anode electrode of a conventional RIE machine, e.g., the anode 18 shown in FIG. 2, and discharging the cathode. Such discharging produces a more anisotropic etching of the substrate than occurs in the absence of such discharging. Thus, an etch profile having, for example, a varying degree of undercutting is achieved by discharging the cathode (thus enhancing the degree of anisotropic etching) in response to a profile (or any portion of the profile) whose degree of undercutting is greater than desired.

Another the substrate is etched, the device is completed by a series of conventional steps which include, for example, a metallization step.

EXAMPLE

The tri-level resist (see, e.g., Moran et al., "High Resolution, Steep Profile, Resist Patterns," *Journal of Vacuum Science Technology*, Vol.. 16, No. 6, pp. 1620–1624, November-December 1979), which is useful for very fine line patterning of substrates, includes successive layers of, for example, x-ray resist, $SiO_2$, and an organic polymer. The organic polyer is, for example, HPR-206 photoresist which is supplied by the Philip A. Hunt Chemical Corporation of Palisades Park, N.J. During the patterning of a substrate, a pattern is initially etched into the x-ray resist. This pattern is transferred from the x-ray resist into the $SiO_2$ layer by a reactive ion etching process in an atmosphere of, for example, $CHF_3$. The $CHF_3$ is used in order to achieve a high etch selectivity between the $SiO_2$ and the HPR-206 (the etch rate of the $SiO_2$ is high compared to the etch rate of the HPR-206). The following shows that the inventive reactive ion etching process enhances the etch selectivity of $SiO_2$ relative to HPR-206, while producing little or no reduction in etch rate.

A layer of $SiO_2$ was deposited onto a three-inch silicon wafer by a conventional plasma-assisted chemical vapor deposition process. The thickness of the $SiO_2$ layer was measured by conventional reflectance spectroscopy and found to be 1 $\mu$m.

The $SiO_2$-covered wafer was mounted on the cathode of a reactive ion etching machine similar to that disclosed in U.S. Pat. No. 4,298,443. This machine includes a circular side wall which is 18 inches in diameter. This side wall is grounded during operation, and serves as the anode. The machine also includes a cylinder, centrally positioned within the machine, which serves as the cathode. The cathode is hexagonal in cross-section, each side of the hexagon being 4.8 inches long. The cathode is 13.9 inches high, and each of the six sides of the cathode is spaced 5 inches from the side wall.

An atmosphere of $CHF_3$, at a pressure of 10 millitorr, was established within the reactive ion etching machine. A plasma glow discharge was then produced by supplying 200 watts of rf power, at a frequency of 13.56 MHz, to the cathode of the reactive ion etching machine, through an impedance matching network and a capacitor, as shown in FIGS. 1 and 2. The magnitude of the (naturally occurring) netative DC bias on the cathode (relative to the grounded anode) was measured with a voltmeter to be 470 volts. The corresponding etch rate of the $SiO_2$ was measured with a laser interferometer to be 152 Å/minute.

The Zener diode circuit depicted in FIG. 2 was then connected between the cathode and the grounded anode of the reactive ion etching machine, during the etching of the $SiO_2$. As a result, the magnitude of the DC bias on the cathode was reduced to 350 volts (the breakdown voltage of the Zener diode) and the etch rate of the $SiO_2$ (as measured by the laser interferometer) was slightly reduced to 135 Å/minute. A second Zener diode was then added to the circuit, and thus the magnitude of the DC bias was further reduced to 250 volts. The corresponding etch rate of the $SiO_2$ increased slightly to 138 Å/minute. The wafer was then removed from the reactive ion etching machine.

A layer of HPR-206 photoresist was spin-deposited onto a second, three-inch silicon wafer. The thickness of the photoresist was measured by conventional reflectance spectroscopy and found to be 1 $\mu$m. The photoresist was then baked at 230 degrees C. for 30 minutes.

The photoresist-covered wafer was mounted on the cathode of the reactive ion etching machine, and etched as described above. At the naturally occurring DC bias (having a magnitude of 470 volts), the etch rate of the photoresist was measured (with the laser interferometer) to be 21.6 Å/minute. When the Zener diode circuit was connected, and the magnitude of the DC bias reduced to 350 volts, the corresponding etch rate of the photoresist was reduced to 19.2 Å/minute. The addition of the second Zener diode to the circuit, which resulted in the magnitude of the DC bias being further reduced to 250 volts, resulted in the etch rate of the photoresist being reduced to 13.1 Å/minute.

The etch rates of the $SiO_2$ and of the HPR-206, as well as the corresponding etch selectivities, i.e., the ratios of the etch rate of the $SiO_2$ to the etch rate of the HPR-206 photoresist, for each magnitude of the three measured DC biases, are listed in Table I. As is evident from this table, the reduction in the magnitude of the DC bias from 470 volts to 250 volts produced by the Zener diode circuit resulted in an increase in etch selectivity from 7.0 to 10.5 (an increase of fifty percent), with only a small decrease in $SiO_2$ etch rate.

TABLE I

| Magnitude of DC Bias (volts) | $SiO_2$ Etch Rate (Å/min.) | HPR-206 Etch Rate (Å/min.) | Etch Selectivity |
|---|---|---|---|
| 470 | 152 | 21.6 | 7.0 |
| 350 | 135 | 19.2 | 7.0 |
| 250 | 138 | 13.1 | 10.5 |

What is claimed is:

1. A method for fabricating a device, comprising the steps of:
   establishing a plasma in a gaseous atmosphere which contacts a first electrode;
   establishing a DC bias on said electrode relative to a point of reference potential; and
   etching a substrate with entities in said plasma characterized in that:
   said method further comprises the step of discharging said electrode in response to a preselected criterion.

2. The method of claim 1 wherein said discharging occurs in response to a DC bias whose magnitude equals, or exceeds, a preselected value.

3. The method of claim 1 wherein said discharging occurs in response to.a deviation from a preselected etch profile.

4. The method of claim 1 wherein said substrate is mounted on said first electrode.

5. The method of claim 1 wherein said substrate is mounted on a second electrode, said second electrode being spaced from said first electrode and connected to a point of reference potential.

6. The method of claim 1 wherein said discharging occurs automatically in response to a DC bias whose magnitude equals, or exceeds, a preselected value.

7. The method of claim 1 wherein said plasma is produced by capacitively coupling AC power into said gaseous atmosphere.

8. The method of claim 1 wherein said plasma is produced by inductively coupling AC power into said gaseous atmosphere.

9. The method of claim 1 wherein said plasma is produced by a DC discharge.

10. The method of claim 7 wherein a frequency of said AD power ranges from about 0.01 MHz to about 500 MHz.

11. The method of claim 8 wherein a frequency of said AC power ranges from about 0.01 MHz to about 500 MHz.

12. The method of claim 1 wherein said discharging occurs over a period of time less than about one-tenth the total etch time of said substrate.

13. The method of claim 1 wherein said discharging occurs over a period of time less than about one-hundredth the total etch time of said substrate.

* * * * *